(12) United States Patent
Miyamoto

(10) Patent No.: US 6,624,062 B2
(45) Date of Patent: Sep. 23, 2003

(54) WIRING STRUCTURE IN SEMICONDUCTOR DEVICE AND METHOD FOR FORMING THE SAME

(75) Inventor: Takaaki Miyamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/993,517

(22) Filed: Nov. 27, 2001

(65) Prior Publication Data

US 2002/0060362 A1 May 23, 2002

Related U.S. Application Data

(62) Division of application No. 09/343,549, filed on Jun. 30, 1999, now Pat. No. 6,337,515.

(30) Foreign Application Priority Data

Dec. 28, 1998 (JP) .......................................... P10-372837
Jul. 31, 1998 (JP) .......................................... P10-217365

(51) Int. Cl.⁷ ......................................... H01L 21/4763
(52) U.S. Cl. ..................... 438/623; 438/627; 438/648
(58) Field of Search .............................. 438/623, 627, 438/648, 653, 656

(56) References Cited

U.S. PATENT DOCUMENTS 5,739,579 A * 4/1998 Chiang et al. .............. 257/635
5,847,463 A * 12/1998 Trivedi et al. ............... 257/751
5,886,410 A * 3/1999 Chiang et al. ............... 257/759
6,093,966 A * 7/2000 Venkatraman et al. ...... 257/751
6,150,252 A * 11/2000 Hsu et al. .................... 438/597
6,340,435 B1 * 1/2002 Bjorkman et al. ............ 216/72

OTHER PUBLICATIONS

Wolf, S., Silicon Processing for the VLSI Era, vol. 2, Lattice Press, pp. 245–252.*

* cited by examiner

Primary Examiner—T. N. Quach
(74) Attorney, Agent, or Firm—Rader, Fishman & Grauer PLLC; Ronald P. Kananen, Esq.

(57) ABSTRACT

A method for forming a wiring structure in a semiconductor device, comprising the steps of:

(a) forming an insulating layer of a low dielectric constant material having a relative dielectric constant of 3.5 or less and a pyrolysis initiation temperature of 400° C. or lower on a substratum and then forming an opening portion and/or a trench portion in the insulating layer, (b) forming a barrier metal layer on the insulating layer including an inside of the opening portion and/or the trench portion, (c) forming a thin layer on the barrier metal layer, and (d) forming a refractory metal layer on the thin layer to fill the inside of the opening portion and/or trench portion with the refractory metal layer, the thin layer being composed of a metal or a metal compound which is less easily oxidizable than a material constituting the barrier metal layer.

3 Claims, 8 Drawing Sheets

[STEP-100]

[STEP-110]

[STEP-120]

[STEP-130]

[STEP-150]

[STEP-160]

[STEP-170]

[STEP-210]

[STEP-230]

[STEP-240]

WIRING STRUCTURE IN SEMICONDUCTOR DEVICE AND METHOD FOR FORMING THE SAME

This application is a Divisional of application Ser. No. 09/343,549, filed on Jun. 30, 1999, now U.S. Pat. No. 6,337,515.

BACKGROUND OF THE INVENTION AND RELATED ART STATEMENT

The present invention relates to a wiring structure in a semiconductor device and a method for forming the wiring structure, and more specifically, it relates to a wiring structure in a semiconductor device, which wiring structure includes contacting holes such as a contact hole, a via hole and a through hole or a trench wiring, and a method for forming the wiring structure.

A semiconductor device has a number of contact holes, through holes or via holes (these will be also generically referred to as "contacting holes" hereinafter). Generally, a contacting hole is formed by forming an insulating layer on an impurity-including region, various electrodes or a lower wiring layer (these will be also generically referred to as "lower conductive layer" hereinafter) formed in or on a semiconductor substrate, or forming an insulating layer on various electrodes or the lower wiring layer formed on a lower insulating layer; forming an opening portion in the insulating layer; and then filling the opening portion with a metal material. With an increase in the integration degree of a semiconductor device, a fine design rule of a semiconductor production process is being employed, and it is an essential object to accomplish a technique of filling an opening portion having a high aspect ratio with a metal material. Further, as a kind of wiring, a trench wiring is practically used which is a technique for forming an insulating layer on a lower insulating layer, forming a trench portion in the insulating layer and then filling the trench portion with a metal material.

With an increase in the integration degree of a semiconductor device, the design rule of a wiring of a semiconductor device keeps on becoming finer, and a signal delay caused by an increase in a capacitance between wirings is a serious problem which inhibits the higher performance of a semiconductor device. As one means for overcoming the above problem, there is known a method in which an insulating layer is composed of a low dielectric constant material, and developments of low dielectric constant materials having a lower relative dielectric constant than a conventional silicon-oxide-film-based material (relative dielectric constant: 4.2) are under way.

The low dielectric constant materials are largely classified into an organic low dielectric constant material and an inorganic low dielectric constant material. Of these, it is said that an organic low dielectric constant material will be a main stream as a low dielectric constant material for materializing a relative dielectric constant of 3 or less required of a semiconductor device to which a design rule of 0.18 μm to 0.13 μm or smaller is applied. The low dielectric constant material is composed of, for example, carbon (C), fluorine (F), oxygen (O) and silicon (Si) as main components, and it is said that due to the contents of carbon (C) and fluorine (F) in particular, the density of the low dielectric constant material can be decreased, and further that the polarizability of molecules per se of the low dielectric constant material can be decreased, so that a low dielectric constant can be materialized.

There is being developed a method for forming a contacting hole and a trench wiring by providing a low dielectric constant material as an insulating layer, which method comprises the steps of forming the insulating layer, forming an opening portion and/or a trench portion in the insulating layer, then, forming a copper (Cu) layer on the entire surface of the insulating layer including insides of the opening portion and/or the trench portion, and then removing the copper layer on the insulating layer. Meanwhile, in the above method, it is required to form a barrier metal layer between the insulating layer and the copper layer for preventing the diffusion of copper atoms into the insulating layer. Tantalum nitride (TaN) is said to be useful as a material for forming the barrier metal layer. However, the barrier metal layer composed of tantalum nitride has problems that it has a high stress and that it shows a low polishing rate during its chemical/mechanical polishing.

There is therefore aggressively developed a method for forming a contacting hole and/or a trench wiring, in which an organic low dielectric constant material is provided for an insulating layer, the insulating layer is formed therefrom, an opening portion and/or a trench portion are formed in the insulating layer, a tungsten layer is formed on the entire surface of the insulating layer including the insides of the opening portion and/or the trench portion according to a chemical vapor deposition method (CVD method), and then, the tungsten layer on the insulating layer is etched back. The above method will be referred to as a blanket tungsten CVD method.

When the tungsten layer is formed on the insulating layer or on the insides of the opening portion and/or the trench portion by the blanket tungsten CVD method, it is required to form a barrier metal layer as an underlayer for the tungsten layer in advance. The reason therefor is that the tungsten layer formed by the blanket tungsten CVD method has poor adhesion to the insulating layer although it is excellent in step coverage. There is another reason that it is also required to prevent the corrosion of the lower conductive layer with a metal fluoride gas such as $WF_6$ which is a process gas for forming the tungsten layer. Further, there is still another reason that since the temperature for forming the tungsten layer by the blanket tungsten CVD method is a relatively high temperature, it is also required to improve the barrier properties for the lower conductive layer.

For the above reasons, the barrier metal layer is formed from, for example, titanium nitride (TiN). In this case, it is preferred to form a titanium (Ti) layer between the barrier metal layer and the lower conductive layer for forming an ohmic contact with the lower conductive layer.

In the formation of the tungsten layer according to a CVD method, conventionally, the insulating layer is heated up to 420 to 470° C. The temperature at which the insulating layer is heated for forming the tungsten layer according to the CVD method will be referred to as "forming temperature" hereinafter. However, when poly(aryl ether) of the following formula is used as a low dielectric constant material, and when the forming temperature is set at 420 to 470° C., there occurs a phenomenon that the inside of the opening portion can no longer reliably filled with a tungsten layer.

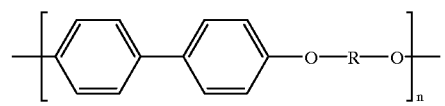

wherein R is an alkyl group $C_nH_{2n+1}$.

That is, a failure in filling a tungsten layer in the opening portion takes place. The above phenomenon is caused by the thermal decomposition or the pyrolysis of poly(aryl ether). A tungsten layer was formed at a forming temperature of 450° C. by a CVD method and analyzed by a secondary ion mass spectroscopy, and FIG. 7A shows the result. For reference purpose, a tungsten layer was also formed at a forming temperature of 375° C. by a CVD method and analyzed in the same manner, and FIG. 7B shows the result. When the results in FIGS. 7A and 7B are compared, it is seen that when the forming temperature is set at 450° C., the pyrolysis of poly(aryl ether) starts, and as a result, a tungsten layer includes larger contents of carbon atoms and oxygen atoms.

When poly(aryl ether) is measured by a Fourier-transform infrared spectroscopy, an infrared absorption spectrum caused by an ether bond is found around 1200 cm$^{-1}$. FIG. 8 shows the relationship between the heating temperature of poly(aryl ether) and a ratio of reduction in infrared absorption at 1200 cm$^{-1}$. The heating was carried out at each temperature for 1 hour or two hours. FIG. 8 also shows that the infrared absorption at 1200 cm$^{-1}$ based on an ether bond sharply decreases when the heating temperature is set at approximately 400° C. or higher, and this data means that the ether bond of poly(aryl ether) is broken at a heating temperature of approximately 400° C. or higher. In other words, poly(aryl ether) has a pyrolysis initiation temperature of approximately 400° C.

In the blanket tungsten CVD method, therefore, attempts have been made to set the forming temperature lower than 400° C., for example, 350° C. to 380° C. At a forming temperature in the above range, however, gases such as CO, $CO_2$, $C_2H_4$ and $H_2O$ are released from poly(aryl ether). As a result, the following phenomenon occurs. Process gases used in the blanket tungsten CVD method, such as $WF_6$, $SiH_4$ and $H_2$, are prevented from entering an opening portion and/or a trench portion formed in the insulating layer, so that it is difficult to form a tungsten layer inside the opening portion and/or the trench portion, and the opening portion and/or the trench portion can no longer reliably filled with the tungsten layer.

Further, as shown in FIG. 9, with a decrease in the forming temperature, the tensile stress of a tungsten layer increases. As a result, a phenomenon that the tungsten layer undergoes cracking takes place, and the reliability of the wiring structure decreases.

Further, the barrier metal layer composed of TiN is liable to be oxidized. When the barrier metal layer surface is oxidized, it is difficult to grow crystal nuclei of tungsten when tungsten is grown on the barrier metal layer by the blanket tungsten CVD method, and the crystal growth of the tungsten layer is inhibited. It is therefore required to prevent the surface oxidation of the barrier metal layer to the lowest level possible. For example, there is known a method in which a side-wall of SiN is formed on the inner wall surface of the opening portion to prevent oxygen atoms from reaching the barrier metal layer from the insulating layer. Since, however, the above method involves a problem that the diameter of the opening portion decreases since the side-wall of an insulating material is formed on the inner wall surface of the opening portion or has a difficulty in that it is required to use SiN having a high relative dielectric constant, the above method cannot be said to be a satisfactory solution means when a low dielectric constant material is used for the insulating layer.

OBJECT AND SUMMARY OF THE INVENTION

It is therefore a first object of the present invention to a method for forming a wiring structure in a semiconductor device, in which an opening portion and/or a trench portion formed in an insulating layer composed of a low dielectric constant material can be highly reliably filled with a refractory metal layer when a contacting hole and/or a trench wiring is formed, and a semiconductor device obtained by the above method.

Further, it is a second object of the present invention to provide a wiring structure in a semiconductor device, which, in addition to achieving the above first object, can prevent a refractory metal layer from undergoing cracking and is free from the inhibition of growth of the refractory metal layer, and a method for forming the wiring structure.

It is further a third object of the present invention to provide a wiring structure in a semiconductor device, which, in addition to achieving the above first object, can reliably prevent the adverse influence caused by the gas released from an insulating layer composed of a low dielectric constant material and is free from the inhibition of growth of the refractory metal layer, and a method for forming the wiring structure.

The method for forming a wiring structure in a semiconductor device, provided by the present invention, for achieving the above first object comprises the steps of:

(a) forming an insulating layer of a low dielectric constant material having a relative dielectric constant of 3.5 or less and a pyrolysis initiation temperature of 400° C. or lower on a substratum and then forming an opening portion and/or a trench portion in the insulating layer, (b) forming a barrier metal layer on the insulating layer including inside(s) of the opening portion and/or the trench portion, (c) forming a thin layer on the barrier metal layer, and (d) forming a refractory metal layer on the thin layer to fill the inside(s) of the opening portion and/or trench portion with the refractory metal layer, the thin layer being composed of a metal or a metal compound which is less easily oxidizable than a material constituting the barrier metal layer (that is, a metal or a metal compound having a higher free energy for forming an oxide of a metal element which is a component of the thin layer than the free energy for forming an oxide of a metal element which is a component of the barrier metal layer).

In the method for forming a wiring structure in a semiconductor device in the present invention, for achieving the above second object, preferably, the thin layer has a compression stress, and the refractory metal layer has a tensile stress. This method for forming a wiring structure in a semiconductor device, provided by the present invention, will be referred to as the method for forming a wiring structure in a semiconductor device according to the first aspect of the present invention for the convenience.

In the method for forming a wiring structure in a semiconductor device according to the first aspect of the present invention, the temperature for heating the insulating layer during the formation of the refractory metal layer is required to be lower than the pyrolysis initiation temperature of the low dielectric constant material constituting the insulating layer. In this case, the value of the compression stress of the thin layer can be controlled by controlling the condition of forming the thin layer, and the value of the tensile stress of the refractory metal layer can be controlled by controlling the condition of forming the refractory metal layer. Preferably, the thin layer is formed by a sputtering method, and the refractory metal layer is formed by a chemical vapor deposition method (CVD method) while heating the insulating layer at a temperature lower than the pyrolysis initiation temperature of the low dielectric constant material constituting the insulating layer. When the thin layer is formed by a sputtering method, for example, the value of the compression stress of the thin layer can be controlled by controlling the forming temperature, the pressure of a forming atmosphere and an inputted direct current power during the formation of the thin layer. When the refractory metal layer is formed by a CVD method, the value of the tensile stress of the refractory metal layer can be controlled by controlling a composition of the process gases, the forming temperature and the pressure of a forming atmosphere.

In the method for forming a wiring structure in a semiconductor device in the present invention, for achieving the above third object, preferably, the step (c) comprises a step of forming the thin layer of a metal or a metal compound on the barrier metal layer by an ionized sputtering method or a long throw sputtering method, and the above step (d) comprises a step of forming a refractory metal layer on the thin layer by a chemical vapor deposition method to fill the inside(s) of the opening portion and/or the trench portion with the refractory metal layer. This method for forming a wiring structure in a semiconductor device, provided by the present invention, will be referred to as a method for forming a wiring structure in a semiconductor device according to the second aspect of the present invention for the convenience. In this case, the temperature for heating the insulating layer during the formation of the refractory metal layer is required to be lower than the pyrolysis initiation temperature of the low dielectric constant material constituting the insulating layer. The above ionized sputtering method refers to a sputtering method in which particles sputtered from a target are passed through a plasma having an electron density of $10^{10}$ to $10^{12}$ cm$^{-3}$ and the sputtered particles ionized by their collision with the plasma are directed perpendicularly to the insulating layer with a bias voltage applied to the substratum, which method can improve the coverage on the opening portion and/or the trench portion. The above long throw sputtering method refers to a sputtering method in which the distance between the target and the substratum is increased to intensify the perpendicular directionality of the sputtered particles to the insulating layer, which method can also improve the coverage on the opening portion and/or the trench portion.

The wiring structure in a semiconductor device, provided by the present invention, for achieving the above first object comprises:

(A) an insulating layer composed of a low dielectric constant material having a relative dielectric constant of 3.5 or less and a pyrolysis initiation temperature of 400° C. or lower, and formed on a substratum, (B) a barrier metal layer covering an opening portion and/or a trench portion formed in the insulating layer, (C) a thin layer formed on the barrier metal layer, and (D) a refractory metal layer formed on the thin layer and filled in the opening portion and/or the trench portion, the thin layer being composed of a metal or a metal compound which is less easily oxidizable than a material constituting the barrier metal layer (that is, a metal or a metal compound having a higher free energy for forming an oxide of a metal element which is a component of the thin layer than the free energy for forming an oxide of a metal element which is a component of the barrier metal layer).

For achieving the above second object, preferably, the wiring structure in a semiconductor device, provided by the present invention, has a constitution in which the thin layer has a compression stress and the refractory metal layer has a tensile stress. The above wiring structure in a semiconductor device, provided by the present invention, will be referred to as the wiring structure in a semiconductor device according to the first aspect of the present invention for the convenience.

In the wiring structure in a semiconductor device or the method for forming the wiring structure according to the first aspect of the present invention, there can be employed a constitution in which tungsten (W), molybdenum (Mo) or tantalum (Ta) is used as a metal for constituting the thin layer, tungsten (W) is used as a metal for constituting the refractory metal layer, and titanium nitride (TiN) is used as a material for constituting the barrier metal layer, while the metal for the thin layer is the most preferably tungsten (W). Otherwise, there can be employed a constitution in which tungsten nitride ($WN_x$), molybdenum nitride ($MoN_y$) or tantalum nitride ($TaN_z$) is used as a metal compound for constituting the thin layer, tungsten (W) is used as a metal for constituting the refractory metal layer, and titanium nitride (TiN) is used as a material for constituting the barrier metal layer, while the thin layer is the most preferably composed of tungsten nitride ($WN_x$). It is preferred to form a titanium (Ti) layer between the substratum and the barrier metal layer in advance for forming an ohmic contact.

In the wiring structure in a semiconductor device or the method for forming the wiring structure according to the first aspect of the present invention, desirably, the absolute value of a difference between the absolute value of the compression stress of the thin layer and the absolute value of the tensile stress of the refractory metal layer is $2\times10^9$ Pa ($2\times10^{10}$ dyne/cm$^2$) or less, preferably $1\times10^9$ Pa ($1\times10^{10}$ dyne/cm$^2$) or less. Preferably, the absolute value of the compression stress of the thin layer is $1\times10^8$ Pa ($1\times10^9$ dyne/cm$^2$) to $2\times10^9$ Pa ($2\times10^{10}$ dyne/cm$^2$), and the absolute value of the tensile stress of the refractory metal layer is $1\times10^8$ Pa ($1\times10^9$ dyne/cm$^2$) to $2\times10^9$ Pa ($2\times10^{10}$ dyne/cm$^2$).

A thin layer or a refractory metal layer is formed on a surface of a silicon semiconductor substrate, and the silicon semiconductor substrate is measured for a distortion caused by the formation (curvature of the silicon semiconductor substrate). The compression stress or the tensile stress can be calculated on the basis of the above distortion.

For achieving the above third object, the wiring structure in a semiconductor device, provided by the present invention, preferably has a constitution in which the thin layer is formed by an ionized sputtering method or a long throw sputtering method, and the refractory metal layer is formed by a chemical vapor deposition method. This wiring structure in a semiconductor device, provided by the present invention, will be referred to as the wiring structure in a semiconductor device according to the second aspect of the present invention for the convenience.

In the wiring structure in a semiconductor device or the method for forming the wiring structure according to the second aspect of the present invention, there can be employed a constitution in which a metal or a metal compound for constituting the thin layer is one selected from refractory metals such as tungsten (W) and tantalum (Ta) or metal compounds having a high melting point such as tungsten nitride ($WN_x$) and tantalum nitride ($TaN_y$), while it is preferred to use tungsten as a metal for constituting the thin layer. Further, it is preferred to employ a constitution in which tungsten is used as a metal for constituting the refractory metal layer and titanium nitride (TiN) is used as a material for constituting the barrier metal layer. It is preferred to form a titanium (Ti) layer between the substratum and the barrier metal layer in advance for forming an ohmic contact.

In the wiring structure in a semiconductor device or the method for forming the wiring structure, provided by the present invention, the low dielectric constant material includes poly(aryl ether), a cyclic fluorine resin, polytetrafluoroethylene, aryl ether fluoride, polyimide fluoride, benzocyclobutene, amorphous carbon and organic SOG. A second insulating layer of $SiO_2$ or the like may be formed on the insulating layer. The material for the second insulating layer is not limited to the low dielectric constant material. When the second insulating layer is formed in the wiring structure in a semiconductor device or the method for forming the wiring structure, provided by the present invention, the formation of the barrier metal layer on the above second insulating layer is conceptually included in "forming a barrier metal layer on the insulating layer (composed of a low dielectric constant material) including inside(s) of the opening portion and/or the trench portion".

The substratum may be constituted of, for example, an silicon semiconductor substrate, a semi-insulating substrate, an insulating substrate or one of various lower insulating layers formed on these substrates. The above substrates or the various lower insulating layers may have a lower conductive layer formed thereon or therein. The lower conductive layer includes an impurity-containing region (for example, source/drain regions) formed in a semiconductor substrate or a semi-insulating substrate, various electrodes or a lower wiring layer, and various electrodes or a lower wiring layer formed on the lower insulating layer. A contacting hole can be formed by filling the inside of the opening portion with the refractory metal layer. The contacting hole generically includes a contact hole, a through hole and a via hole. A trench wiring can be formed by filling the inside of the trench portion with the refractory metal layer. Further, an opening portion is formed in the bottom of the trench portion, whereby a trench wiring and a contacting hole connected to the trench wiring can be simultaneously formed. Further, a trench portion and an opening portion are provided respectively, the trench wiring and the contacting hole can be simultaneously formed.

In the present invention, the thin layer is composed of a metal or a metal compound which is less easily oxidizable than a material constituting the barrier metal layer, the thin layer corresponding to an underlayer for forming the refractory metal layer is less easily oxidizable, and there can be therefore avoided the problem that it is difficult to form the refractory metal layer.

In the wiring structure in a semiconductor device or the method for forming the wiring structure according to the first aspect of the present invention, the refractory metal layer having a tensile stress is formed on the thin layer having a compression stress, and the tensile stress of the refractory metal layer is therefore offset, so that the cracking of the refractory metal layer can be effectively prevented.

Further, in the wiring structure in a semiconductor device or the method for forming the wiring structure according to the second aspect of the present invention, the thin layer of a metal or a metal compound is formed on the barrier metal layer by the ionized sputtering method or the long throw sputtering method in which the directionality of sputtered particles are intensified, so that the coverage of the thin layer in the bottom of the opening portion and/or the trench portion can be improved. Further, for example, if a bias is applied to the substratum, the thin layer deposited in the bottom of the opening portion and/or the trench portion is re-sputtered, and as a result, the coverage of the thin layer on the inner wall surface(s) of the opening portion and/or the trench portion can be improved. Moreover, the thin layer is composed of a material which is less easily oxidizable than a material constituting the barrier metal layer. Therefore, not only the oxidation of the barrier metal layer can be prevented when the refractory metal layer is formed on the thin layer by a CVD method, but also the thin layer works as a barrier against gas released from the low dielectric constant material, and the process gases which the CVD method uses cannot be inhibited from entering the opening portion and/or the trench portion formed in the insulating layer composed of the low dielectric constant material. Therefore, the process gases are easily adsorbed on, and dissociated from, the thin layer, so that the opening portion and/or the trench portion can be reliably filled with the refractory metal layer. Further, if the thin layer is composed of the same refractory metal as the refractory metal which is to form the refractory metal layer to be formed on the thin layer, for example, if the thin layer is composed of tungsten, crystal nuclei of tungsten are easily formed on the thin layer, and the opening portion and/or the trench portion can be more reliably filled with the refractory metal layer. The above thin layer can therefore constitute an underlayer for forming the refractory metal layer according to a CVD method.

BRIEF DESCRIPTION OF THE DRAWINGS

FIG. 1C, are schematic partial cross-sectional views of an insulating layer, etc., for explaining the method for forming the wiring structure in Example 1.

FIG. 2C, is a schematic partial cross-sectional view of an insulating layer, etc., for explaining the method for forming the wiring structure in Example 1.

DESCRIPTION OF THE PREFERRED EMBODIMENTS

EXAMPLE 1

Example 1 is concerned with the method for forming a wiring structure in a semiconductor device according to the first and second aspects of the present invention. In Example 1, a lower wiring layer is formed on a lower insulating layer, an insulating layer is formed on the lower insulating layer including the lower wiring layer, and a contacting hole (via hole) is formed by forming an opening portion in the insulating layer on the lower wiring layer and filling the opening portion with a refractory metal layer. Poly(aryl ether) is used as a low dielectric constant material for the insulating layer. A barrier metal layer is composed of titanium nitride (TiN), and a thin layer of tungsten (W) is formed by a sputtering method. Further, a refractory metal layer of tungsten is formed by a CVD method. The wiring structure in a semiconductor device and the method for forming it in Example 1 will be explained with reference to FIGS. 1A, 1B, 1C, 2A, 2B, 2C and 3 showing schematic partial cross-sectional views of the insulating layer and the like hereinafter.

[Step-100]

First, various elements including a semiconductor device element are formed, for example, in a silicon semiconductor substrate, and then a lower insulating layer 10 is formed on the silicon semiconductor substrate. Then, a lower wiring layer 11 composed mainly of aluminum or copper is formed on the lower insulating layer 10 (see FIG. 1A). The lower insulating layer 10 on which the lower wiring layer 11 is formed corresponds to a substratum. The above steps can be carried out according to known methods. Figures omit showing of the silicon semiconductor substrate and the various elements.

[Step-110]

Then, an insulating layer 12 composed of a low dielectric constant material (specifically, poly(aryl ether)) having a relative dielectric constant of 2.8 and a pyrolysis initiation temperature of 400° C. or lower is formed on the substratum, specifically, on the lower insulating layer 10 including the lower wiring layer 11. That is, 3 to 5 cm³ of a poly(aryl ether) solution is dropped on the lower insulating layer 10 including the lower wiring layer 11, and the silicon semiconductor substrate is spun or turned at a rate of 2500 to 3000 rpm to uniformly apply the poly(aryl ether) solution onto the lower insulating layer 10 including the lower wiring layer 11. Then, the product is subjected to baking treatment in a nitrogen gas atmosphere at 150° C. for 1 minute and at 250° C. for 1 minute. The silicon semiconductor substrate is transferred into a curing furnace and then subjected to curing treatment in a nitrogen gas atmosphere at 425° C. for 1 hour, whereby a insulating layer 12 of 0.5 µm thickness composed of poly(aryl ether) can be formed (see FIG. 1B).

[Step-120]

Figure 1A:
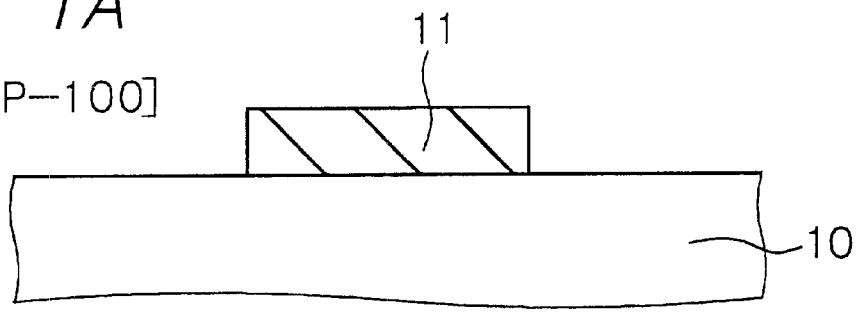
FIGS. 1A, 1B and 1C are schematic partial cross-sectional views of an insulating layer, etc., for explaining the method for forming a wiring structure in Example 1.
Figure 1B:
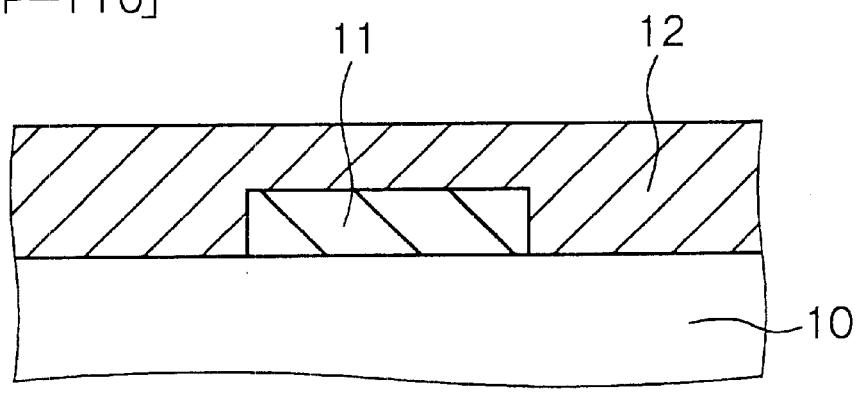
Figure 1C:
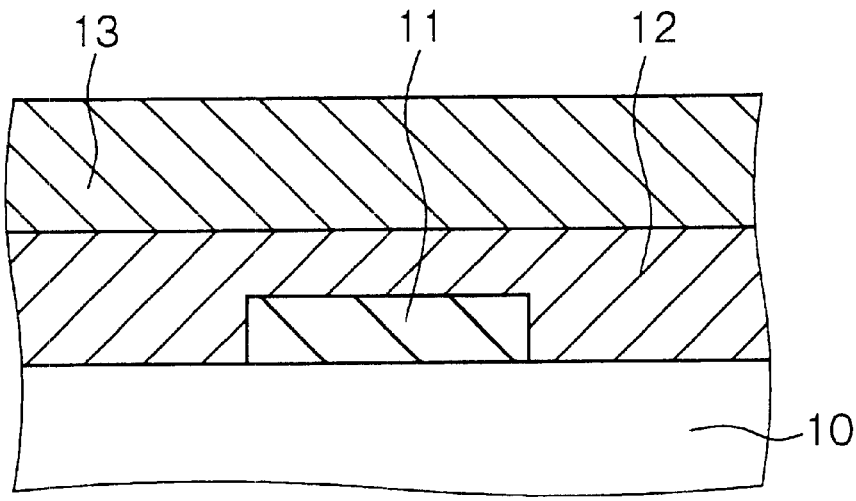

A second insulating layer 13 composed of $SiO_2$ is formed on the insulating layer 12 by a plasma CVD method under conditions shown in Table 1 below, although the formation of the second insulating layer 13 is not any essential requirement (see FIG. 1C).

TABLE 1

| | |
|---|---|
| Process gas | $SiH_4/N_2O$ = 50/1000 sccm |
| Pressure | $1.3 \times 10^3$ Pa (10 Torr) |
| RF power | 0.5 kW (13.56 MHz) |
| Forming temperature | 350° C. |
| Layer thickness | 0.6 µm |

[Step-130]

Then, an etching resist is formed on the second insulating layer 13 according to a lithography method, and the second insulating layer 13 is etched by a magnetron etching method under conditions shown in Table 2 below. Further, the insulating layer 12 is etched by an ECR etching method under conditions shown in Table 3 below, to form an opening portion 14 in the insulating layer 12 above the lower wiring layer 11 and in the second insulating layer 13, and then the etching resist is removed (see FIG. 2A).

TABLE 2

| | |
|---|---|
| Gas used | $C_4F_8/CO/Ar/O_2$ = 14/250/100/2 sccm |
| Etching temperature | 20° C. |
| Pressure | 5.3 Pa |
| Source power | 1.6 kW |

TABLE 3

| | |
|---|---|
| Gas used | $N_2/He$ = 40/165 sccm |
| Etching temperature | −50° C. |
| Pressure | 0.8 Pa |
| Microwave power | 0.5 kW |
| Substrate bias | 0.1 kW |

[Step-140]

A barrier metal layer 15 of approximately 50 nm thickness composed of TiN is formed on the insulating layer including the inside of the opening portion 14 (on the second insulating layer 13 in Example 1) by a sputtering method. In Example 1, before the formation of the barrier metal layer 15, a titanium (Ti) layer of approximately 20 nm thickness (not shown) is formed by a sputtering method. The titanium layer and the barrier metal layer 15 are preferably formed by a long throw sputtering method in which the distance between the silicon semiconductor substrate and a target is increased to intensify the directionality of sputtered particles in the perpendicular direction toward the silicon semiconductor substrate. Otherwise, the titanium layer and the barrier metal layer 15 composed of TiN may be formed by an ionized sputtering method in which sputtered titanium particles collide with a high-density argon plasma to be ionized and enter perpendicularly to the substratum in a bias-applied state. Further, only the approximately 50 nm barrier metal layer 15 composed of TiN may be formed.

[Step-150]

Figure 2A:
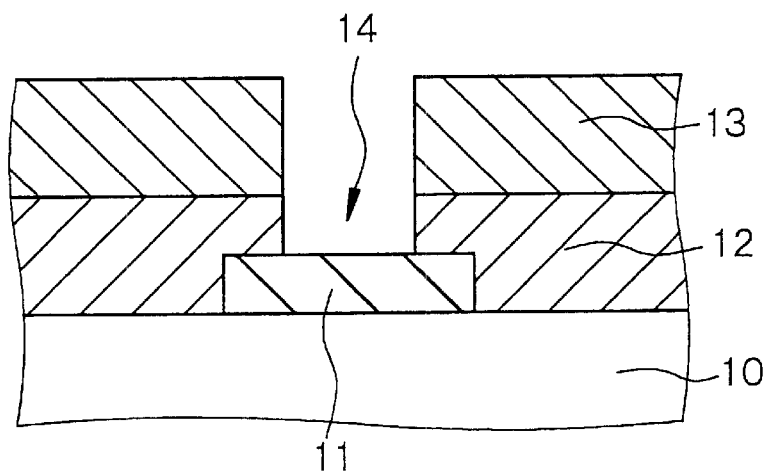
FIGS. 2A, 2B and 2C, following
Figure 2B:
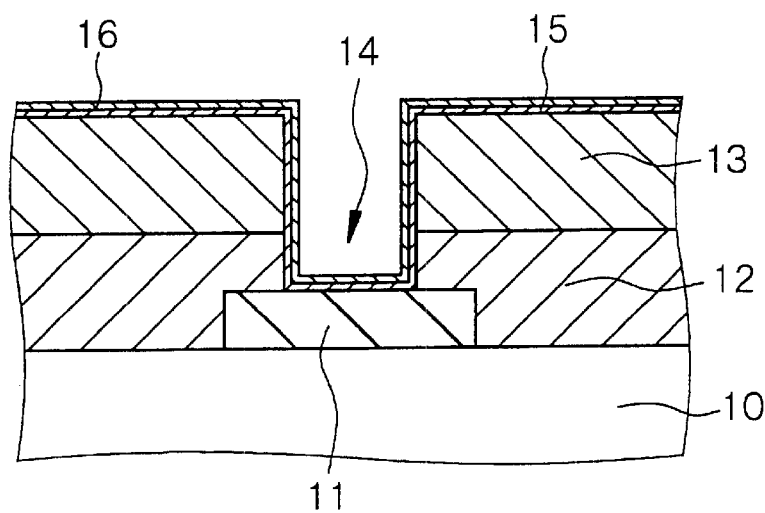

Then, a thin layer 16 composed of tungsten is formed on the barrier metal layer 15 by a long throw sputtering method (see FIG. 2B). The value of compression stress of the thin layer 16 can be controlled by controlling the conditions of the sputtering method for forming the thin layer 16, i.e., the forming temperature, a pressure in a forming atmosphere and an inputted direct current power. More specifically, the absolute value of compression stress of the thin layer 16 increases with a decrease in the forming temperature, with a decrease in the pressure of the forming atmosphere and with an increase in the inputted direct-current power. When a thin layer composed of tungsten is formed under sputtering conditions shown in Table 4 as examples, the absolute value of the compression stress of the thin layer is $1 \times 10^8$ Pa to $2 \times 10^9$ Pa. In Table 4 and Table 9, "Distance" refers to a distance from a target to a substratum.

TABLE 4

| | |
|---|---|
| Forming temperature | Room temperature to 200° C. |
| Pressure of forming atmosphere | 0.07 to 0.47 Pa (0.5 mTorr to 3.5 mTorr) |
| Inputted direct-current voltage | 1 to 2.5 kW |
| Thickness of thin layer | 30 to 100 nm |
| Distance | 1.5 to 3.0 cm |

Figure 6A:
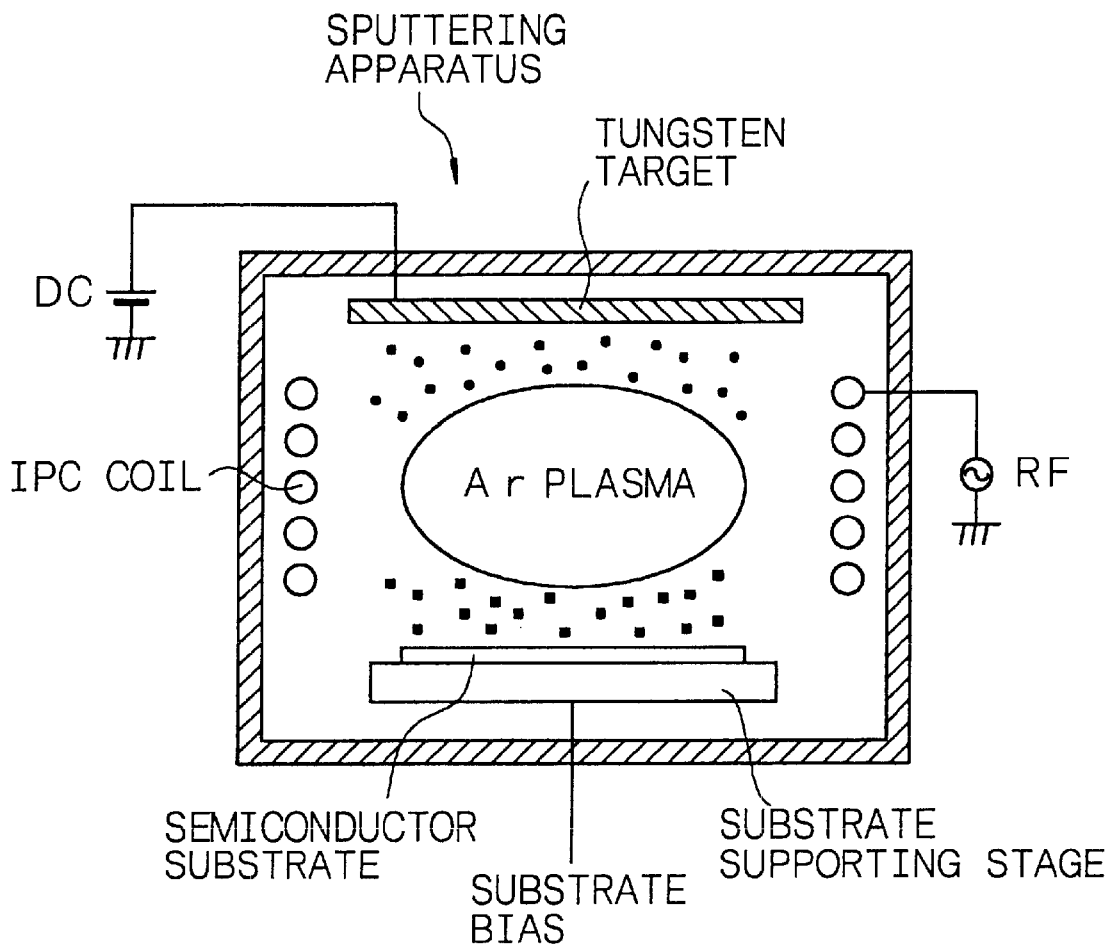
FIG. 6A schematically shows a DC magnetron sputtering apparatus.
Figure 6B:
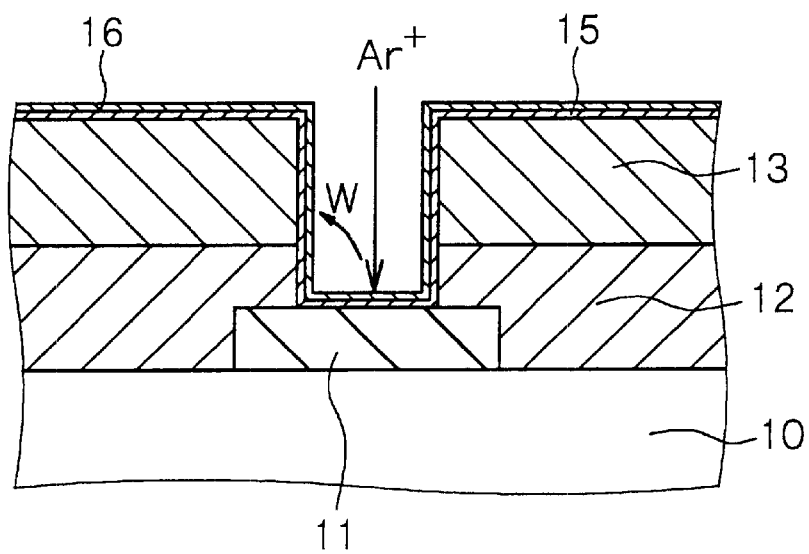
FIG. 6B schematically shows a state where tungsten particles deposited in the bottom of an opening portion are re-sputtered with argon ion.
Figure 7B:
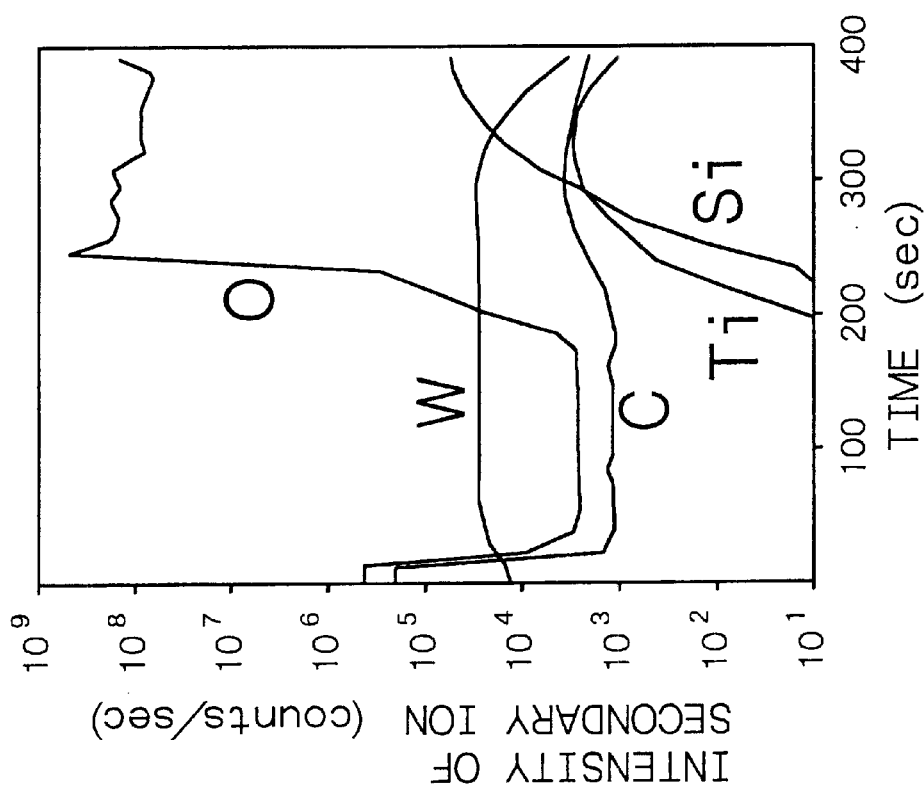
FIGS. 7A and 7B are graphs showing results of analysis of a tungsten layer formed by a CVD method by a secondary ion mass spectroscopy.
Figure 7A:
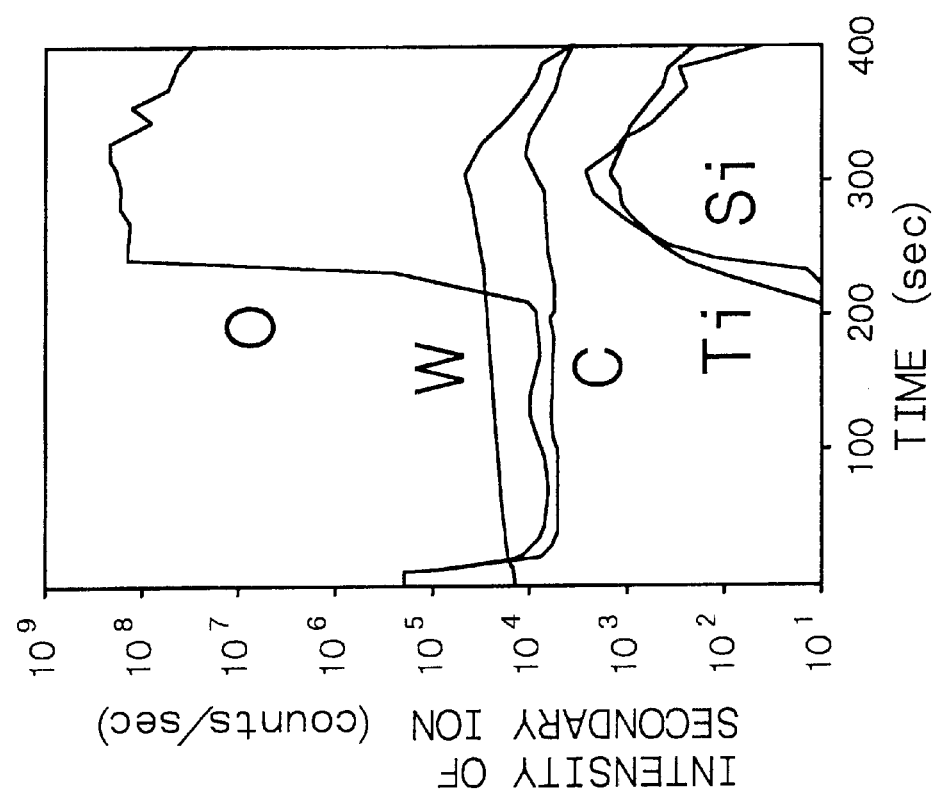
Figure 8:
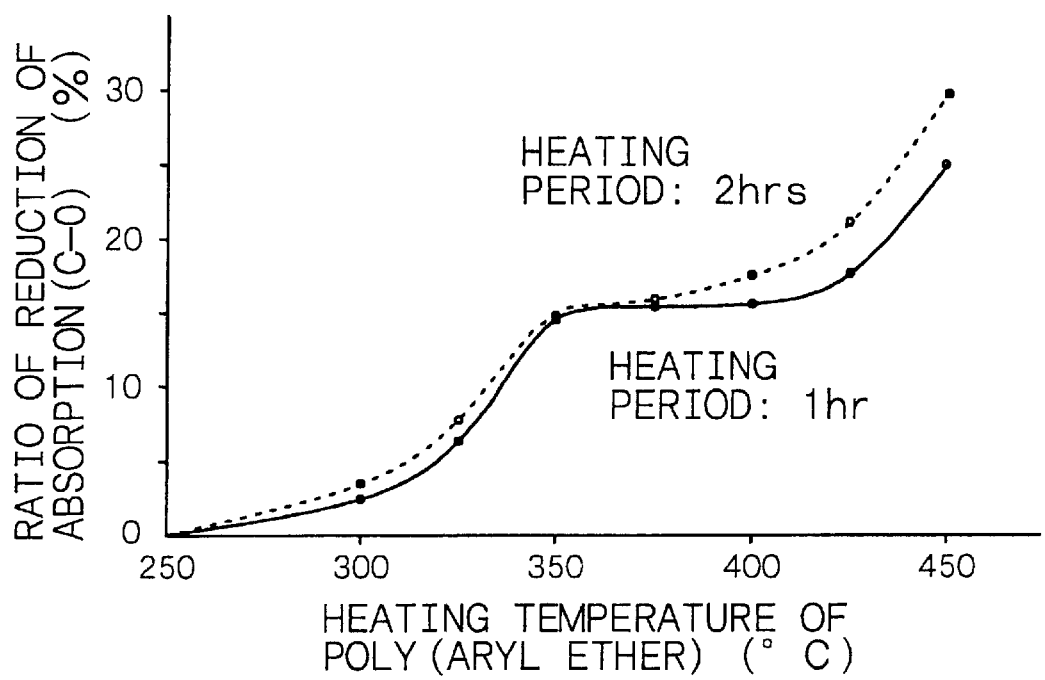
FIG. 8 is a graph showing a relationship between the heating temperature of poly(aryl ether) and a ratio of a reduction in infrared absorptivity at 1200 $cm^{-1}$.
Figure 9:
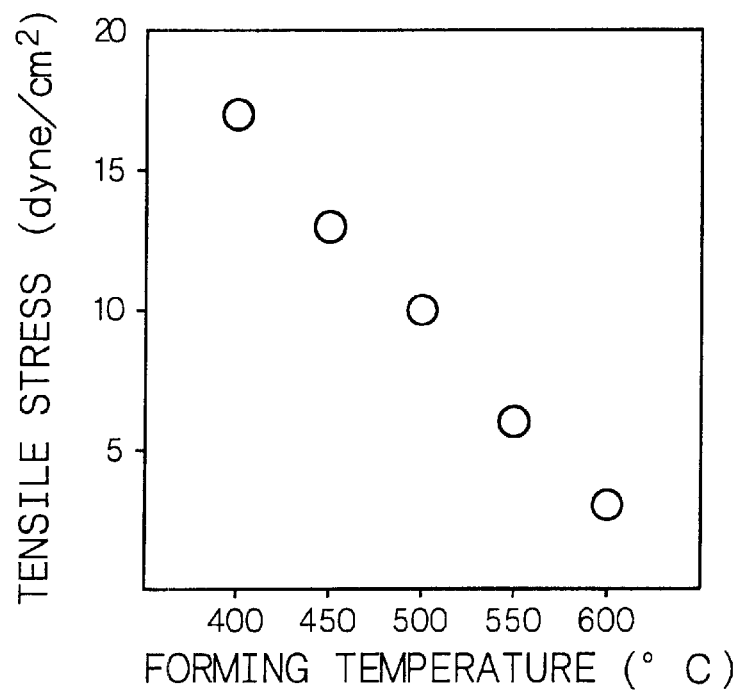
FIG. 9 is a graph showing a relationship between a forming temperature for forming a tungsten layer according to a CVD method and the tensile stress of the tungsten layer.

Otherwise, the thin layer 16 composed of tungsten may be formed on the barrier metal layer 15 by an ionized sputtering method under conditions shown in Table 5 below. Specifically, a silicon semiconductor substrate is transferred into a DC magnetron sputtering apparatus prepared with IPC coils for generating IPC plasma as schematically shown in FIG. 6A. In the sputtering apparatus, tungsten particles (shown by black dots in FIG. 6A) sputtered from a tungsten target collide with ions, radicals and electrons in a high density of argon (Ar) plasma generated with the IPC coils, and are ionized. The so-formed tungsten ions (shown by black solid squares in FIG. 6A) are accelerated perpendicularly to the substratum on the basis of a plasma sheath or a substrate bias, and as a result, those tungsten particles which arrive at the bottom portion of the opening portion 14 increase in number, so that the coverage in the bottom portion is improved. In this case, if the substrate bias is varied, tungsten particles deposited in the bottom of the opening portion 14 are re-sputtered with argon ions as schematically shown in FIG. 6B to be deposited on the inner wall surface of the opening portion 14, so that the coverage in the inner wall surface of the opening portion 14 can be improved.

TABLE 5

| Forming temperature | 150 to 200° C. |
|---|---|
| Pressure of forming atmosphere | Ar, 1.3 to 6.7 Pa (10 mTorr to 50 mTorr) |
| Power applied to target | 1.5 to 2.5 kW |
| Power applied to IPC coils | 1.5 to 2.5 kW |
| Bias voltage | 50 to 150 W |

[Step-160]

Then, a refractory metal layer 17 composed of tungsten is formed on the thin layer 16 by a CVD method. For preventing the formation of the refractory metal layer 17 from suffering the adverse influence caused by carbon and oxygen generated due to the pyrolysis of the insulating layer 12 composed of poly(aryl ether), the temperature for heating the insulating layer 12 during the formation of the refractory metal layer 17 by the CVD method is set at a temperature lower than the pyrolysis initiation temperature of the low dielectric constant material constituting the insulating layer 12. More specifically, while the insulating layer 17 is heated at a temperature equal to, or lower than, 400° C. at which the pyrolysis of the low dielectric constant material (poly(aryl ether)) constituting the insulating layer 12 is initiated, the refractory metal layer 17 is formed by the CVD method. When the refractory metal layer 17 is formed by the CVD method, the value of tensile stress of the refractory metal layer 17 can be controlled by controlling the composition of the process gases, the forming temperature and the pressure of a forming atmosphere. Table 6 shows an example of conditions of forming the refractory metal layer 17 composed of tungsten by the CVD method. Under these conditions, the $H_2$ gas flow rate which is 500 to 1000 sccm under general CVD forming conditions is increased to 2000 sccm. With a decrease in the forming temperature, the tensile stress increases, while the value of tensile stress of the refractory metal layer 17 composed of tungsten can be decreased by increasing the $H_2$ gas flow rate. The absolute value of tensile stress of the refractory metal layer 17 formed under the CVD conditions shown in Table 6 is $1 \times 10^8$ Pa to $2 \times 10^9$ Pa. Desirably, the conditions of forming the thin layer 16 and the conditions of forming the refractory metal layer 17 are selected such that the absolute value of a difference between the absolute value of the compression stress of the thin layer 16 and the absolute value of the tensile stress of the refractory metal layer 17 is $2 \times 10^9$ Pa or less, preferably $1 \times 10^9$ Pa or less.

TABLE 6

| Process gas | $WF_6/H_2/N_2/Ar$ = 80/2000/100/1900 sccm |
|---|---|
| Forming temperature | 350 to 375° C. |
| Pressure of forming atmosphere | $5 \times 10^3$ to $5 \times 10^4$ Pa |

Otherwise, the refractory metal layer 17 composed of tungsten is formed on the thin layer 16 by the CVD method under conditions shown in Tables 7 and 8. Tungsten nuclei are formed under the conditions shown in Table 7, and the opening portion 14 is filled with a tungsten layer under conditions shown in Table 8.

TABLE 7

| Process gas | $WF_6/SiH_4/H_2/Ar$ = 30/15/1000/2800 sccm |
|---|---|
| Forming temperature | 350 to 380° C. |
| Pressure of forming atmosphere | $4 \times 10^3$ Pa (30 Torr) |

TABLE 8

| Process gas | $WF_6/H_2/Ar$ = 75/500/2800 sccm |
|---|---|
| Forming temperature | 350 to 380° C. |
| Pressure of forming atmosphere | $1.1 \times 10^4$ Pa (80 Torr) |

Figure 2C:
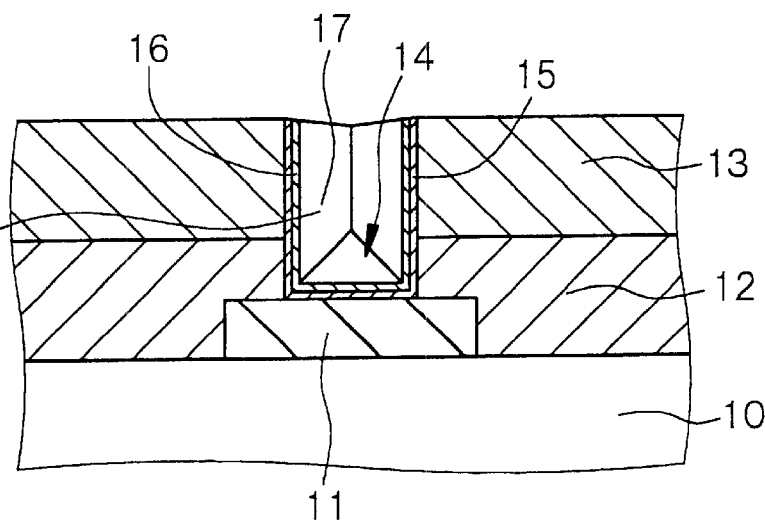

Then, the refractory metal layer 17, the thin layer 16, the barrier metal layer 15 and the titanium layer on the second insulating layer 13 are etched back, or are removed by a chemical/mechanical polishing method (CMP method), whereby there can be formed a contact hole (via hole) 18 in which the opening portion 14 is filled with tungsten which constitutes the refractory metal layer (see FIG. 2C).

[Step-170]

Figure 3:
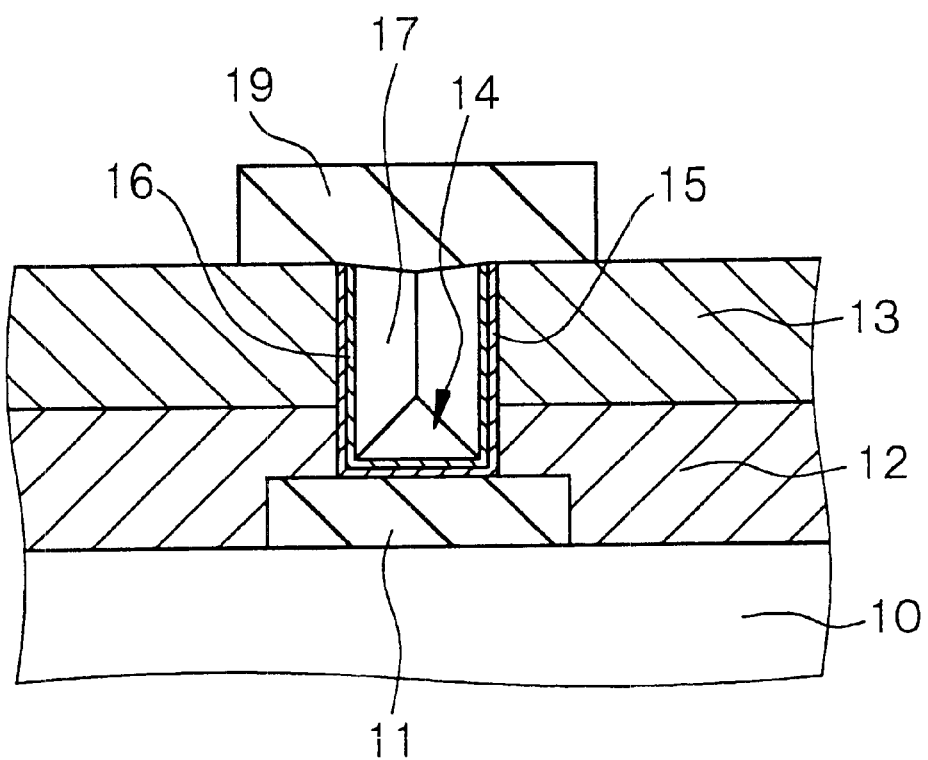
FIG. 3, following

Then, for example, aluminum-alloy-containing metal layer is formed on the second insulating layer 13, and the aluminum-alloy-containing layer is patterned, to form an upper wiring 19 (see FIG. 3).

The thin layer 16 and the refractory metal layer 17 obtained under the conditions shown in Tables 4 and 6 have compression stress and tensile stress, respectively. The refractory metal layer 17 is formed on the thin layer 16, so that the tensile stress of the refractory metal layer 17 is offset. As a result, the occurrence of cracking of the refractory metal layer 17 can be reliably inhibited. Further, the thin layer 16 composed of tungsten is less easily oxidizable than the barrier metal layer 15 composed of TiN. There can be therefore avoided the problem that it is difficult to form the refractory metal layer 17.

Further, if the thin layer 16 composed of tungsten is formed under conditions shown in Tables 4 and 5, and if the refractory metal layer 17 composed of tungsten is formed under conditions shown in Tables 7 and 8, the oxidation of the barrier metal layer 15 can be prevented, and further, even if gas is released from the low dielectric constant material, the thin layer 16 works as a barrier, and the process gases used in the CVD method are not inhibited from entering the opening portion 14 formed in the insulating layer 12 composed of the low dielectric constant material. And, the process gases used for the formation of the refractory metal layer 17 are easily adsorbed on, and dissociated from, the thin layer, and as result, the opening portion 14 can be reliably filled with the refractory metal layer 17. Moreover, in Example 1, the thin layer 16 and the refractory metal layer 17 are composed of tungsten, and crystal nuclei of tungsten are therefore easily formed on the thin layer during the formation of the refractory metal layer 17 by the CVD method. As a result, the opening portion 14 can be more reliably filled with tungsten.

EXAMPLE 2

Figure 4A:
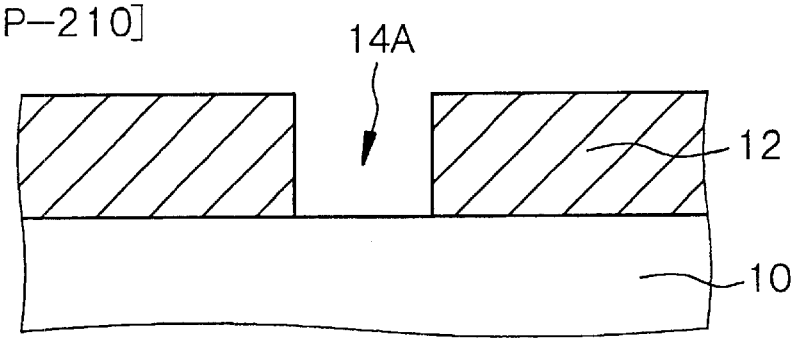
FIGS. 4A, 4B and 4C are schematic partial cross-sectional views of an insulating layer, etc., for explaining the method for forming a wiring structure in Example 2.
Figure 4B:
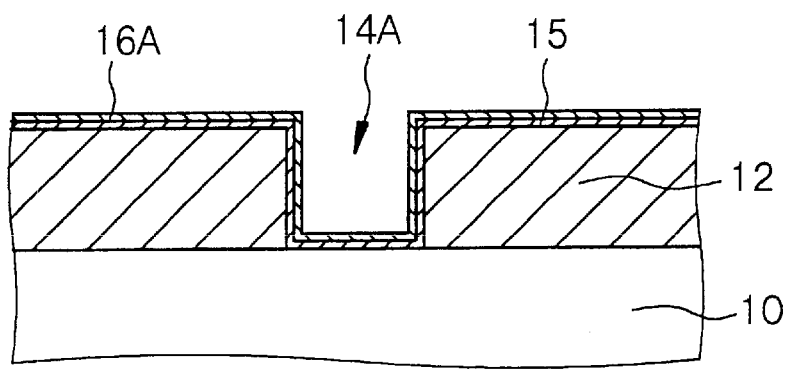
Figure 4C:
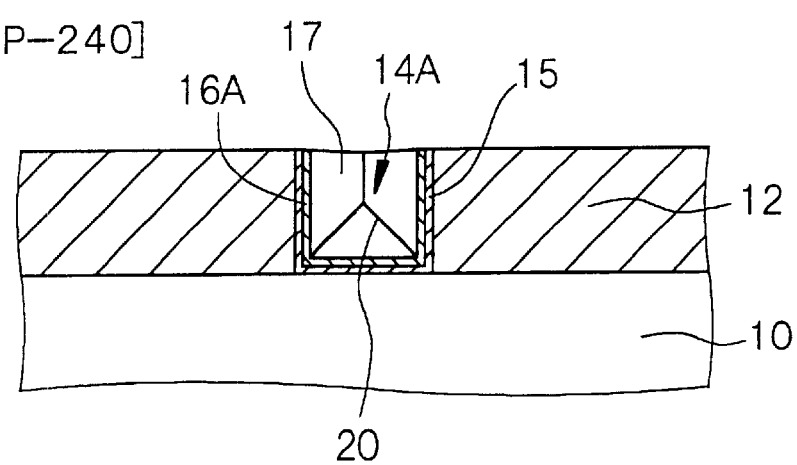

Example 2 is also concerned with the wiring structure in a semiconductor device according to the first and second aspects of the present invention. In Example 2, a thin layer composed of tungsten nitride ($WN_x$) is formed by a long throw sputtering method. Further, an insulating layer is formed on a lower insulating layer, a trench portion is formed in the insulating layer, and a trench wiring is formed by filling the trench portion with a refractory metal layer. Like Example 1, poly(aryl ether) is used as a low dielectric constant material for constituting the insulating layer. Further, a barrier metal layer is composed of TiN, and the refractory metal layer composed of tungsten is formed by a CVD method. The wiring structure in a semiconductor device and the method for forming the wiring structure in Example 2 will be explained with reference to FIGS. 4A, 4B and 4C showing schematic cross-sectional views of the insulating layer, etc., hereinafter.

[Step-200]

First, various elements are formed, for example, in a silicon semiconductor substrate, and then, a lower insulating layer 10 is formed on the silicon semiconductor substrate. Then, an insulating layer 12 of 0.5 μm thickness composed of poly(aryl ether) which is a low dielectric constant material is formed on a substratum, specifically the lower insulating layer 10. The method for forming the insulating layer 12 is the same as that described in Step-110 in Example 1.

[Step-210]

Then, an etching resist is formed on the insulating layer 12 by a lithography method, and the insulating layer 12 is etched by an ECR etching method under conditions shown in Table 3 to form a trench portion 14A in the insulating layer 12. Then, the etching resist is removed (see FIG. 4A).

[Step-220]

Then, a barrier metal layer 15 of approximately 50 nm thickness composed of TiN is formed on the insulating layer 12 including the inside of the trench portion 14A by a long throw sputtering method in the same manner as in Step-140 in Example 1. In Example 2, before the formation of the barrier metal layer 15, a titanium (Ti) layer of approximately 20 nm thickness (not shown) is formed by a long throw sputtering method in advance as well.

[Step-230]

Then, a thin layer 16A composed of $WN_x$ is formed on the barrier metal layer 15 by a long throw sputtering method (see FIG. 4B). The value of compression stress of the thin layer 16A can be controlled by controlling the conditions of forming the thin layer 16A by the sputtering method, i.e., the process gas flow rate, the forming temperature, the pressure of a forming atmosphere and the inputted direct-current power. More specifically, the absolute value of compression stress of the thin layer 16A increases with a decrease in the forming temperature, with a decrease in the pressure of the forming atmosphere and with an increase in the inputted direct-current power. When the thin layer 16A composed of $WN_x$ is formed under long throw sputtering conditions shown in Table 9 as an example, the absolute value of compression stress of the thin layer 16A is $1 \times 10^8$ Pa to $2 \times 10^9$ Pa.

TABLE 9

| | |
|---|---|
| Process gas flow rate | $N_2/Ar$ = 0.5/1 to 3/1 |
| Forming temperature | Room temperature to 200° C. |
| Pressure of forming atmosphere | 0.07 to 0.47 Pa (0.5 mTorr to 3.5 mTorr) |
| Inputted direct-current voltage | 1 to 2.5 kW |
| Thickness of thin layer | 30 to 100 nm |
| Distance | 1.5 to 3.0 cm |

[Step-240]

Then, a refractory metal layer 17 composed of tungsten is formed on the thin layer 16A by a CVD method in the same manner as in Step-160 in Example 1. For preventing the formation of the refractory metal layer 17 from suffering the adverse influence caused by carbon and oxygen generated due to the pyrolysis of the insulating layer 12 composed of poly(aryl ether), the temperature for heating the insulating layer 12 during the formation of the refractory metal layer 17 by the CVD method is set at a temperature lower than the pyrolysis initiation temperature of the low dielectric constant material constituting the insulating layer 12. More specifically, while the insulating layer 17 is heated at a temperature equal to, or lower than, 400° C. at which the pyrolysis of the low dielectric constant material (poly(aryl ether)) constituting the insulating layer 12 is initiated, the refractory metal layer 17 is formed by the CVD method. When the refractory metal layer 17 is formed by the CVD method, the value of tensile stress of the refractory metal layer 17 can be controlled by controlling the composition of the process gases, the forming temperature and the pressure of a forming atmosphere. The conditions of forming the refractory metal layer 17 composed of tungsten by the CVD method can be set as shown in Table 6. The absolute value of tensile stress of the refractory metal layer 17 formed under the CVD conditions shown in Table 6 is $1 \times 10^8$ Pa to $2 \times 10^9$ Pa. Desirably, the conditions of forming the thin layer 16A and the conditions of forming the refractory metal layer 17 are selected such that the absolute value of a difference between the absolute value of the compression stress of the thin layer 16A and the absolute value of the tensile stress of the refractory metal layer 17 is $2 \times 10^9$ Pa or less, preferably $1 \times 10^9$ Pa or less. Then, the refractory metal layer 17, the thin layer 16A, the barrier metal layer 15 and the titanium layer on the insulating layer 12 are etched back or are removed by a CMP method, whereby there can be obtained a trench wiring 20 in which the trench portion is filled with the tungsten layer which constitutes the refractory metal layer (see FIG. 4C).

The thin layer 16A and the refractory metal layer 17 obtained under the conditions shown in Tables 9 and 6 have compression stress and tensile stress, respectively. The refractory metal layer 17 is formed on the thin layer 16A, so that the tensile stress of the refractory metal layer 17 is offset. As a result, the occurrence of cracking of the refractory metal layer 17 can be reliably inhibited. Further, the thin layer 16A composed of $WN_x$ is less easily oxidizable than the barrier metal layer 15 composed of TiN. There can be therefore avoided the problem that it is difficult to form the refractory metal layer 17.

In the formation of the refractory metal layer 17 by the CVD method in Step-240, the thin layer 16A composed of $WN_x$ is formed as an underlayer in advance. Therefore, the oxidation of the barrier metal layer 15 can be prevented, and further, even if gas is released from the low dielectric constant material, the thin layer 16A works as a barrier, and the process gases used in the CVD method are not inhibited from entering the trench portion 14A formed in the insulating layer 12 composed of the low dielectric constant material. And, the process gases used in the CVD method are easily adsorbed on, and dissociated from, the thin layer, and as result, the trench portion 14A can be reliably filled with the refractory metal layer 17.

Figure 5A:
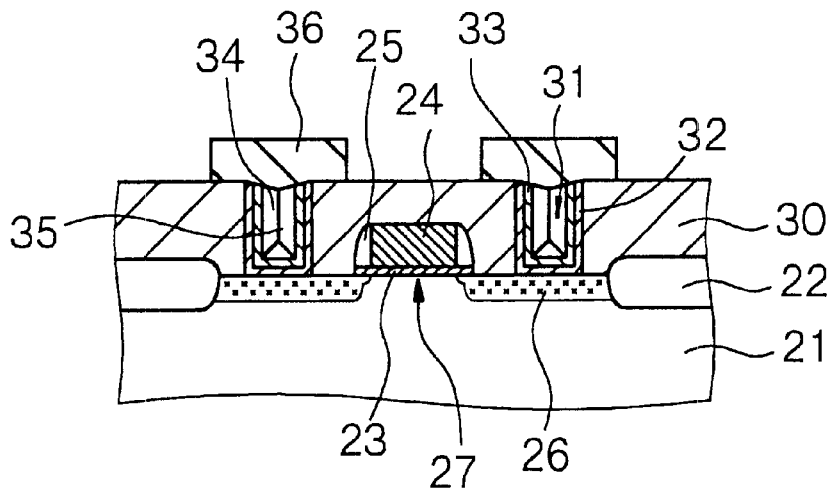
FIGS. 5A and 5B are schematic partial cross-sectional views of an insulating layer, etc., for explaining a variant of the wiring structure in a semiconductor device in Example 1.

The present invention has been explained with reference to Examples hereinabove, while the present invention shall not be limited thereto. The conditions and the method for forming the thin layers and the conditions and the method for forming the refractory metal layer, explained in Examples, are given for illustrative purposes, and can be altered as required. The structure of the semiconductor device is also given for illustrative purposes. The present invention can be applied, for example, to a wiring structure having contact holes as contacting holes and the method for forming the same as shown in FIG. 5A. In the semiconductor device shown in FIG. 5A, a gate electrode 24 having, for example, a polyside structure is formed on a gate insulating film 23 composed of $SiO_2$ which is formed on the surface of a silicon semiconductor substrate 21 by a thermal oxidation method, and gate side-walls 25 composed of an insulating material are formed on the side walls of the gate electrode 24. Further, source/drain regions 26 are formed in a portion of the silicon semiconductor substrate 21 surrounded by a channel-forming region 27 formed below the gate electrode 24 and an isolation region 22. And, an insulating layer 30 composed of a low dielectric constant material is formed on the entire surface. An opening portion 31 is formed in the insulating layer 30 above the source/drain regions 26, and a titanium (Ti) layer (not shown), a barrier metal layer 32 composed of TiN and a thin layer 33 composed of tungsten are formed inside the opening portion 31. Further, the opening portion 31 is filled with a refractory metal layer 34 composed of tungsten, whereby a contacting hole (contact hole) 35 is formed. Reference numeral 36 indicates a wiring formed on the insulating layer 30.

Figure 5B:
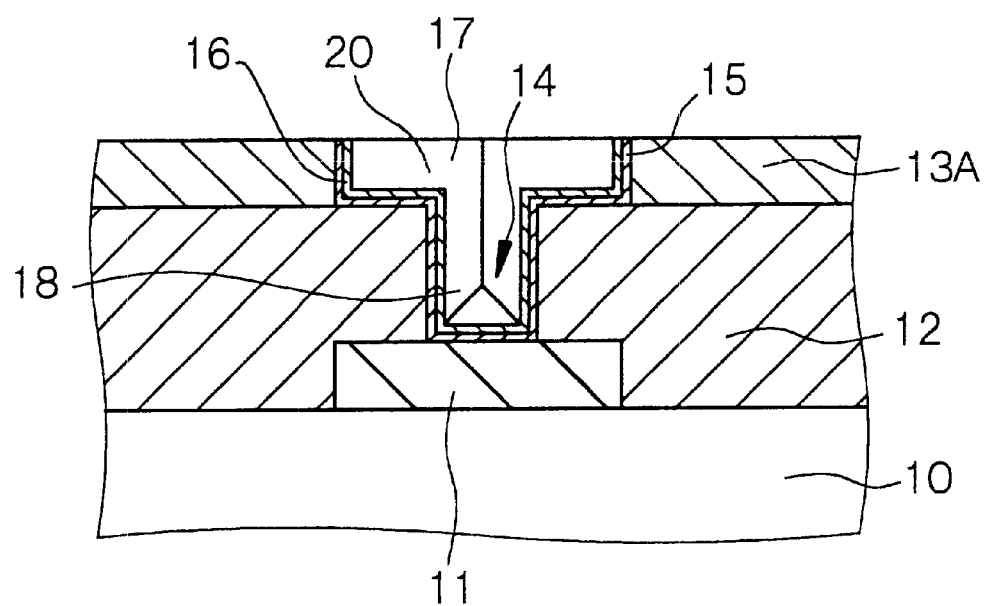

Further, the present invention can be also applied to a wiring structure having a so-called dual-damascence structure in which an opening portion is formed in the bottom of a trench portion whereby a trench wiring and a contacting hole connected to the trench wiring are simultaneously formed as shown in FIG. 5B, and a method for forming the same. In the wiring structure shown in FIG. 5B, preferably, a second insulating layer 13A is composed of a low dielectric constant material having a relative dielectric constant of 3.5 or less and a pyrolysis initiation temperature of 400° C. or lower.

The barrier metal layer and the titanium layer have a compression stress or a tensile stress depending upon their forming conditions. It is therefore more preferred to determine the conditions of forming the thin layer and the conditions of forming the refractory metal layer while taking account of the compression stresses or the tensile stresses of the barrier metal layer and the titanium layer. When the barrier metal layer and the titanium layer have compression stresses, desirably, the absolute value of a difference between the absolute value of total value of the value of compression stress of the thin layer, the value of compression stress of the barrier metal layer and the value of compression stress of the titanium layer and the absolute value of tensile stress of the refractory metal layer is adjusted to $2\times10^9$ Pa or less, preferably $1\times10^9$ Pa or less. Further, when the barrier metal layer and the titanium layer have tensile stresses, desirably, the absolute value of a difference between the absolute value of compression stress of the thin layer and the absolute value of total value of the value of tensile stress of the refractory metal layer, the value of tensile stress of the barrier metal layer and the value of tensile stress of the titanium layer is adjusted to $2\times10^9$ Pa or less, preferably $1\times10^9$ Pa or less. The value of compression stress of the thin layer is a value per unit cross-sectional area of the thin layer. The value of actual compression stress of the thin layer is therefore in proportion to the thickness of the thin layer. It is therefore preferred to optimize the thickness of the thin layer such that the tensile stress of the refractory metal layer is offset and that the cracking of the refractory metal layer can be reliably prevented, and further, it is also preferred to optimize the thickness of the barrier metal layer and the thickness of the titanium layer in some cases.

The barrier metal layer is required to have a thickness equal to, or greater than, the thickness that is required for its inherent barrier properties. Further, the titanium layer, when it has too large a thickness, forms an alloy with an underlayer (for example, a silicon semiconductor substrate) and as a result, the wiring structure shows an increase in resistance in some cases. Preferably, therefore, the thickness of each of the barrier metal layer and the titanium layer is adjusted to the smallest thickness with which a desired resistance value can be obtained and which is determined by taking account of the values of compression stress of the thin layer and the value of tensile stress of the refractory metal layer.

In the present invention, the thin layer corresponding to an underlayer for the formation of the refractory metal layer is less easily oxidizable, and there can be avoided the problem that it is difficult to form the refractory metal layer. Further, the cracking of the refractory metal layer can be reliably prevented. Even if gas is released from the low dielectric constant material, the opening portion and/or the trench portion can be reliably filled with the refractory metal layer, and the coverage of the thin layer in the inner wall surface(s) of the opening portion and/or the trench portion can be improved. As a result, a wiring structure having high reliability can be formed in a semiconductor device, and the production yield of semiconductor devices can be improved.

What is claimed is:

1. A method for forming a wiring structure in a semiconductor device, comprising:

(a) forming an insulating layer of a low dielectric constant material having a relative dielectric constant of 3.5 or less and a pyrolysis initiation temperature of 400° C. or lower on a substratum and then forming an opening portion and/or a trench portion in the insulating layer, (b) forming a barrier metal layer on the insulating layer including an inside of the opening portion and/or the trench portion, (c) forming a layer on the barrier metal layer that is composed of a metal or a metal compound which is less easily oxidizable than a material constituting the barrier metal layer, and (d) forming a refractory metal layer on the layer formed on the barrier metal layer, to fill the inside of the opening portion and/or trench portion with the refractory metal layer, in which the layer formed on the barrier metal layer has a compression stress, and the refractory metal layer has a tensile stress, where the absolute value of a difference between the absolute value of the compression stress of the metal layer and the absolute value of the tensile stress of the refractory metal layer is $2\times10^9$ Pa or less.

2. The method for forming a wiring structure in a semiconductor device according to claim 1, in which tungsten, molybdenum or tantalum is used as a metal for constituting the layer formed on the barrier metal layer, tungsten is used as a metal for constituting the refractory metal layer, and titanium nitride is used as a material for constituting the barrier metal layer.

3. The method for forming a wiring structure in a semiconductor device according to claim 1, in which tungsten nitride, molybdenum nitride or tantalum nitride is used as a metal compound for constituting the layer formed on the barrier metal layer, tungsten is used as a metal for constituting the refractory metal layer, and titanium nitride is used as a material for constituting the barrier metal layer.

* * * * *